United States Patent
Leneke et al.

(10) Patent No.: US 7,842,922 B2
(45) Date of Patent: Nov. 30, 2010

(54) THERMOPILE INFRARED SENSOR ARRAY

(75) Inventors: Wilhelm Leneke, Dresden (DE);
Marion Simon, Bad Schwalbach (DE);
Mischa Schulze, Meissen (DE);
Karlheinz Storck, Pesterwitz (DE);
Joerg Schieferdecker, Dresden (DE)

(73) Assignee: Heimann Sensor GmbH, Dresden (DE)

( * ) Notice: Subject to any disclaimer, the term of this patent is extended or adjusted under 35 U.S.C. 154(b) by 528 days.

(21) Appl. No.: 11/913,443

(22) PCT Filed: May 16, 2006

(86) PCT No.: PCT/DE2006/000841

§ 371 (c)(1),
(2), (4) Date: Dec. 31, 2007

(87) PCT Pub. No.: WO2006/122529

PCT Pub. Date: Nov. 23, 2006

(65) Prior Publication Data
US 2008/0216883 A1    Sep. 11, 2008

(30) Foreign Application Priority Data
May 17, 2005    (DE)    ........................ 10 2005 023 333

(51) Int. Cl.
*G01J 5/16*    (2006.01)
*G01J 5/04*    (2006.01)
*G01J 5/12*    (2006.01)

(52) U.S. Cl. ................. 250/338.1; 250/332; 250/338.4; 257/E27.13; 257/E27.001; 257/E27.122; 257/461; 257/465; 257/466

(58) Field of Classification Search ................. 250/332, 250/338.4, 436, 338.1; 257/E27.13, E27.001, 257/E27.122, 461, 465, 466; 438/55
See application file for complete search history.

(56) References Cited

U.S. PATENT DOCUMENTS 5,056,929 A * 10/1991 Watanabe et al. ........... 374/181

(Continued)

FOREIGN PATENT DOCUMENTS

DE    19923606 A1    1/2000

(Continued)

OTHER PUBLICATIONS

"Operational amplifier low pass filter circuit", Retrieved from the internet <http://www.radio-electronics.com/info/circuits/opamp_low_pass_filter/op_amp_lowpassfilter.php>; Retrieved on [Jul. 22, 2010]; published Oct. 29, 2005.*

(Continued)

*Primary Examiner*—David P Porta
*Assistant Examiner*—Yara B Green
(74) *Attorney, Agent, or Firm*—Heslin Rothenberg Farley & Mesiti P.C.

(57)    ABSTRACT

A thermopile infrared sensor array, comprises a sensor chip with a number of thermopile sensor elements, made from a semiconductor substrate and corresponding electronic components. The sensor chip is mounted on a support circuit board and enclosed by a cap in which a lens is arranged. The aim is the production of a monolithic infrared sensor array with a high thermal resolution capacity with a small chip size and which may be economically produced. The aim is achieved by arranging a thin membrane made from non-conducting material on the semiconductor substrate of the sensor chip on which the thermopile sensor elements are located in an array. Under each thermopile sensor element, the back side of the membrane is uncovered in a honeycomb pattern by etching and the electronic components are arranged in the boundary region of the sensor chip. An individual pre-amplifier with a subsequent low-pass filter may be provided for each column and each row of sensor elements.

25 Claims, 7 Drawing Sheets

U.S. PATENT DOCUMENTS

Figure 1:
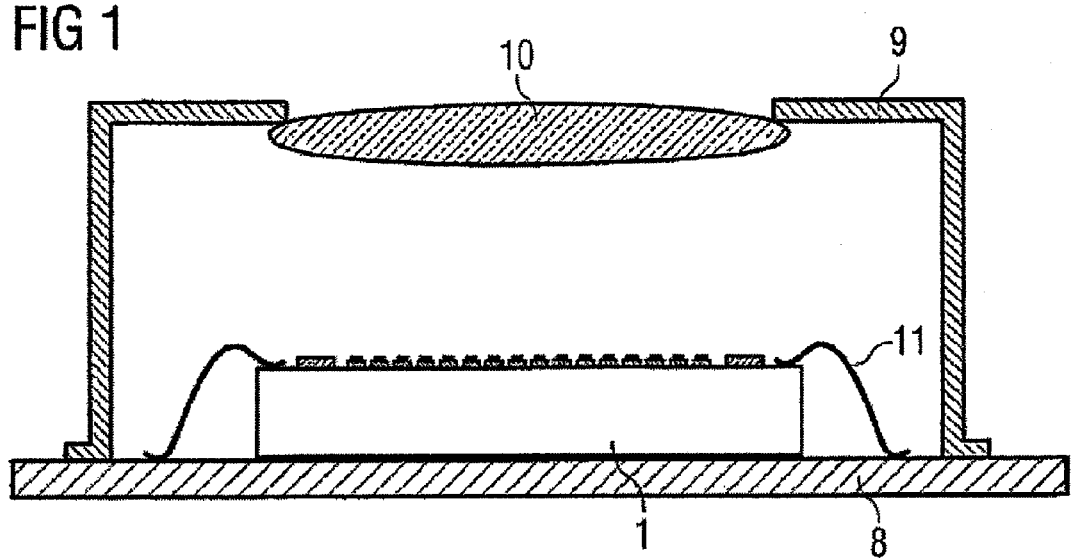

| | | | | |
|---|---|---|---|---|
| 5,583,058 | A | * | 12/1996 | Utsumi et al. ............ 250/338.4 |
| 5,789,797 | A | * | 8/1998 | Ikuta et al. .................. 257/533 |
| 5,808,350 | A | | 9/1998 | Jack et al. |
| 5,962,854 | A | * | 10/1999 | Endo .......................... 250/349 |
| 6,294,787 | B1 | * | 9/2001 | Schieferdecker et al. .... 250/349 |
| 6,372,656 | B1 | * | 4/2002 | Laermer et al. ............ 438/719 |
| 6,504,153 | B1 | * | 1/2003 | Shigenaka et al. ....... 250/338.4 |
| 6,649,913 | B1 | | 11/2003 | Kennedy et al. |
| 6,710,348 | B1 | | 3/2004 | Rothley et al. |
| 2001/0035559 | A1 | | 11/2001 | Ando et al. |
| 2004/0079888 | A1 | * | 4/2004 | Inamura ..................... 250/353 |
| 2007/0187602 | A1 | | 8/2007 | Wennmacher et al. |

FOREIGN PATENT DOCUMENTS

| | | |
|---|---|---|
| DE | 103 21639 A1 | 2/2004 |
| DE | 10322860 A1 | 12/2004 |
| EP | 1045233 A2 | 10/2000 |

OTHER PUBLICATIONS

Baltes et al. "Micromachines Thermally Based CMOS Microsensors" Proceedings of the IEEE, vol. 86, No. 8, Aug. 1998.

Eminoglu et al. "A Low-cost 64x64 Uncooled Infrared Detector Array in Standard CMOS" Transducers'03, The 12th International Conference on Solid State Sensors, Actuators and Microsystems, Boston, Jun. 8-12, 2008, pp. 316-319.

Jansson et al. "FOA/DSTO Uncooled IRFPA Development" Part of the SPIE Conference on Infrared Technology and Applications XXV, Orlando, FL, Apr. 1999. SPIE vol. 3698, pp. 264-275.

Rogalski, A. "Optical Detectors for Focal Plane Arrays" Opto-Electronics Review 12(2), 221-245, (2004).

Oliver et al. "A 1024-Element Bulk-Micromachined Thermopile Infared Imaging Array" Sensors and Actuators 73 (1999), 222-231.

International Search Report for PCT/DE2006/000841 dated Aug. 7, 2006.

Jansson C. et al; "FOA/DSTO uncooled IRFPA development" Infrared Technology and Applications XXV, Apr. 5-9, 1999, Orlando, FL. Proceedings of the SPIE-The International Society for Optical Engineering SPIE-Int. Soc. Opt. Eng USA I, XP002393166.

Rogalski A: "Optical detectors for focal plane arrays" Opto-electronics Review Assoc. Polish Electrical Engineers Poland, Bd. 12, Nr. 2, 2004, Seiten 221-245, XP002393167.

Oliver A D et al: A 1024-element bulk-micromachined thermopile infrared imaging array Sensors and Actuators A, Elsevier Sequoia S.A., Lausanne, CH, Bd. 73, Nr. 3, 30. Mar. 30, 1999. XP004167985.

Jansson et al. "FOA/DSTO Uncooled IRFPA Development" Part of the SPIE Conference on Infrared Technology and Applications XXV, Orlando, FL, Apr. 1999. SPIE vol. 3698, pp. 264-275.

Rogalski, A. "Optical Detectors for Focal Plane Arrays" Opto-Electronics Review 12(2), 221-245.

* cited by examiner

THERMOPILE INFRARED SENSOR ARRAY

CROSS REFERENCE TO RELATED APPLICATIONS

This application is a national stage filing under section 371 of PCT International Application No. PCT/DE2006/000841, filed on May 16, 2006, and published in German on Nov. 23, 2006 as WO2006/122529 A2, and claims priority from German patent application No. 10 2005 023 333.3, filed on May 17, 2005, the entire disclosure of these applications being hereby incorporated herein by reference.

BACKGROUND ART

The invention concerns a thermopile infrared sensor array consisting of a sensor chip with a number of thermopile sensor elements constructed on a semiconductor substrate of a sensor chip and corresponding electronic components, like preamplifiers, addressing devices, in which the sensor chip is mounted on a support substrate and closed with a cap in which inlet optics is situated in the center above the sensor chip.

Infrared sensors that can be produced in Si micromachining are known in various types.

For example, a monolithic thermopile sensor array produced in Si micromachining is mentioned in A. D. Oliver, K. D. Wise (University of Michigan): "1024 element bulk micromachined thermopile IR arrays, in Sensors & Actuators 73 (1999), pp. 222-231.

A wet etching technology of the back side is used for the sensor elements, in which residual connectors between the elements of a relatively large 12×12 mm membrane are left as thermal separation pits by a somewhat complicated etching process. Overall a fairly large chip measuring 16×16 mm is obtained for 32×32 elements.

All elements of the array are converted via a multiplexer integrated on the chip into a serial analog signal and amplified by an also integrated preamplifier. This preamplifier must have at least the bandwidth from the image frequency (for example 20 Hz) and the element number (in the presented case 1024), i.e., for example >20 kHz. Since the sensor and preamplifier noise is influenced by the bandwidth of this preamplifier, fairly high noise is obtained, which shifts the detection limit (thermal resolution) to higher temperatures. Consequently, the presented array is also used for temperature measurement at high temperatures of >100° C. For lower temperatures (for example, room temperature) a sufficient signal/noise distance is not obtained.

The sensor chips achieved with the presented wet etching technology are relatively large, which leads to high manufacturing costs.

A monolithic thermopile sensor array in which the sensor elements are produced by surface micromachining with a sacrificial coating is mentioned in Kanno, T. et al. (NEC Corp.): "Uncooled focal plane array having 128×128 thermopile detector elements" in B. Andersen (editor), Infrared Technology, Proc. SPIE 2269, Vol. XX, San Diego, July 1994, pp. 450-459.

The readout technique with a CCD register permits relatively good resolution capacity but only if the sensor chip is capped in a vacuum-tight housing. Vacuum-tight housings, however, increase the sensor costs significantly and limit the applicability for cheap high-volume applications.

A monolithic thermopile sensor array produced in bulk by Si micromachining is mentioned in Schaufelbühl, A., Münch, U. (ETH Zurich): "256 pixel CMOS integrated thermoelectric infrared sensor array" in MEMS 2001, The 14$^{th}$ Intern Conference on Micro Mechanical Systems, Interlaken, Switzerland, Jan. 21-25, 2001, Proceedings, p. 200-203, and in Münch, U. et al.: "Thermoelectric sensor," U.S. Pat. No. 6,040,579. A wet etching technique of the back side is again used. The forming, relatively large membrane is thermally separated by thick gold connectors between the pixels in contrast to A. D. Oliver, K. D. Wise.

A wet etching technology of the back side is used for the sensor elements. The monolithic 16×16 array chip presented by Schaufelbühl, A., Münch, U. with 7.4×12 mm is also fairly large and costly to produce. Two preamplifiers are arranged on the two sides of the chip for preamplification. It is not described how the preamplifiers are connected, but the total noise of the circuit with 256 elements is relatively high because of the high bandwidth and the image frequency remains low and only image frequencies of 1 Hz are mentioned. The power loss [sic] arranged on the two sides of the chip contribute because of their power loss to a thermal offset so that a separation of the sensor chip and preamplifiers is proposed as an alternative.

If, however, individual preamplifiers are arranged outside of the sensor chip, the space requirements and manufacturing costs are further increased.

A monolithic thermal pile sensor array in which the sensor elements are produced by surface micromachining by wet etching of the front is mentioned in Masaki Hirota et al. (Nissan Motor Company): "Thermoelectric Infrared Imaging Sensors for Automotive Applications," Proc. of SPIE, Vol. 5359, pp. 111-125. Each sensor element contains only one thermal element with high sensitivity.

In principle, an acceptable temperature resolution is achieved with this method, in which a vacuum-tight sensor housing is proposed.

The vacuum-tight housing again stands in the way of cost-effective mass production.

A monolithic thermopile sensor array produced in bulk Si micromachining is mentioned in the HORIBA product information: "8×8 element thermopile imager," in Tech Jam International, 26 Sep. 2002.

The 64 elements are situated on an 8×8 mm chip, each element being separated thermally by Si walls in the wet etching technology. The size of the chip related to the process leads to relatively high manufacturing costs and again stands in the way of cost-effective mass applications.

In addition to these thermopile solutions, there are other solutions for low-cost infrared arrays:

Monolithic bolometer structures for infrared sensor arrays are presented in B. E. Cole, C. J. Han (Honeywell Technology Center): "Monolithic 512×512 arrays for infrared scene projection," Conference Transducers 95/Eurosensors, Stockholm, Sweden, 25-29 Jun. 1995, pp. 628-631 or in EP 0 869 341 A1.

The sensor elements in these infrared sensor arrays are produced by surface micromachining, in which removal of a sacrificial coating leads to thermally very well insulated sensor bridges about 2.5 μm above the Si substrate, which contains the evaluation circuit.

Such infrared bolometers with sensor bridges have since become available in many variants. Because they permit very small element dimensions, they are widespread in high-resolution infrared arrays.

In principle, despite the small sensor element dimensions, very good temperature resolutions are achieved with this method. However, the small element dimensions on the silicon surface necessarily require vacuum-tight packing of the sensor chip, which again stands in the way of cost-effective mass production.

Hybrid pyroelectric arrays with a readout circuit in silicon are presented in Q. Q. Zhang, B. P. Loss et al. (Hong Kong University): "Integrated pyroelectric array based on PCLT/P (VDF/TrFE) composite," Sensors & Actuators 86 (2000), pp. 216-219 as well as R. Kennedy McEwen (GEC Marconi): "European Uncooled Thermal Imaging Technology," SPIE, Vol. 3061, 1997, pp. 179-190.

Because of the high sensitivity of the sensor elements pyroelectric sensor arrays permit high thermal resolution. However, the hybrid technology increases the costs in comparison with monolithic sensor arrangements in silicon technology. In addition, pyroelectric sensors generally have the drawback that they only respond to varying objects. For thermal imaging of resting objects—which represents the normal case—continuous modulation of the radiation flux is necessary, which is generally achieved with a mechanical chopper. Additional mechanically moved parts reduce the reliability and increase the mechanical size as well as the costs of an infrared sensor array.

In the prior art cited above thermal infrared sensor arrays are proposed, which have cost drawbacks for production of infrared sensor arrays in large numbers either

- because of a large-surface chip technology (A. D. Oliver, K. D. Wise, Schaufelbühl, A., Münch, U., Münch, U. et al. and Horiba product information)
- a costly vacuum housing technology (Kanno, T. et al., Masaki Hirota et al., B. E. Cole, C. J. Han and Oda, Naoki or
- an additional mechanical chopper assembly. The underlying task of the invention is to provide a monolithic infrared sensor array that has high thermal resolution capacity with a small chip size and can be produced cost-effectively in large numbers without demanding vacuum housing technology or mechanically moving additional parts.

BRIEF SUMMARY OF INVENTION

The task underlying the invention is solved in a thermopile infrared sensor array of the type just mentioned in that a thin membrane of a nonconducting material is arranged on the semiconductor substrate of the sensor chip, on which thermopile sensor elements are situated in an array, the back of the membrane being etched beneath each thermopile sensor element, and in that the electronic components are arranged in the edge area of the sensor chip, at least one individual preamplifier being provided for every fourth, preferably every column or row of sensor elements.

A particularly good thermal resolution capacity is achieved by the invention and thermal influencing of the thermal biosensor elements by the power loss of the necessary electronic components, like preamplifiers, is minimized.

Particular embodiments of the invention are apparent from the corresponding dependent claims.

In a first embodiment of the invention a semiconductor substrate of the sensor chip is provided with recesses beneath the thermopile sensor elements so that in the boundary area between sensor elements thin vertical or almost vertical separation walls of semiconductor substrate material are found and in which the membrane covers the recesses and that the sensor chip has a solid edge area.

A heat sink for the cold thermopile sensor elements and thermal separation of the thermopile sensor elements is achieved by the separating bridges. In addition, mechanical stabilization of the array is also made possible.

In a continuation of the invention the separation walls end above the support substrate so that thermal decoupling is achieved.

This can be achieved in that between the solid edge area and the support substrate spacers are arranged or that the separation walls are shortened by overetching. The spacer must consist of a very good heat-conducting material, like metal, ceramic or also silicon.

To avoid damage to the membrane by overpressure or underpressure in the recess after mounting of the chip on the support substrate, a thin ventilation slit can be provided through the separation walls and through the solid edge area at least for each row or column.

Finally it is prescribed that the individual preamplifiers and other electronic components are uniformly distributed on the edge area of the sensor chip so that uniform heat distribution from the forming heat losses is produced.

The sensor chip is preferably provided with at least one widened edge area on one side, on which the electronic components with higher power loss are arranged.

Another embodiment of the invention is characterized by the fact that the individual preamplifiers are connected to one or more low-pass filters.

In a preferred variant the individual preamplifiers are each connected to a low-pass filter whose limit frequency is the same or not much higher but at most two to three times higher than the row or column readout frequency.

In addition, at least one additional dummy element to compensate for error signals could be assigned to each preamplifier in addition to the actual sensor elements.

The dummy elements then have the same or similar internal resistance as the actual sensor elements and are produced from the same sensor layers as the actual sensor elements, in which either no recess is arranged beneath the dummy elements or the dummy elements are shaded by diaphragms connected in front from the infrared radiation of the measurement object, in which the side of the diaphragms facing the dummy elements should have infrared radiation-absorbing properties.

The dummy elements can also be provided in addition or as an alternative with cover layers that mask or reflect infrared radiation.

In order to achieve thermal insulation between the thermopile sensor elements and the electronics situated in the edge area, the semiconductor substrate can have at least one additional recessed insulation area between the last separation wall of the outer row of thermopile sensor elements and the edge area of the sensor chip.

It is also advantageous if the cap has a surface that absorbs infrared radiation on the side facing the sensor elements.

An aperture that consists of a material that does not reflect infrared radiation or has a surface coating that absorbs infrared radiation can also be arranged within the cap.

Finally, the thin membrane can consist of silicon dioxide, silicon nitride or a similar material.

In another embodiment of the invention it is proposed that the bottom of the sensor chip be mounted at least beneath the silicon support element with a joining material of very high conductivity on the support substrate. As an alternative the connection material can also be arranged beneath the separation walls.

A metal- or ceramic-filled adhesive, a metallic solder or a metal- or ceramic-filled glass mass is suitable as connection material.

BRIEF DESCRIPTION OF THE DRAWING FIGURES

Figure 2A:
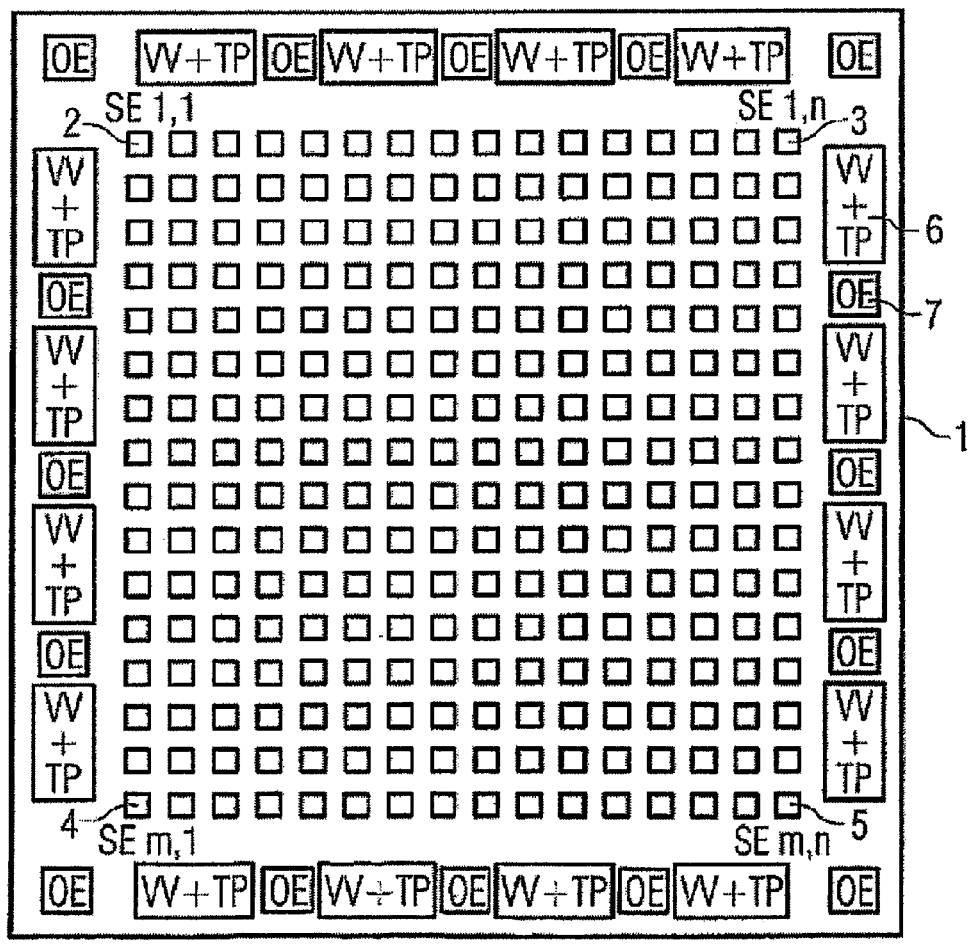
Figure 2B:
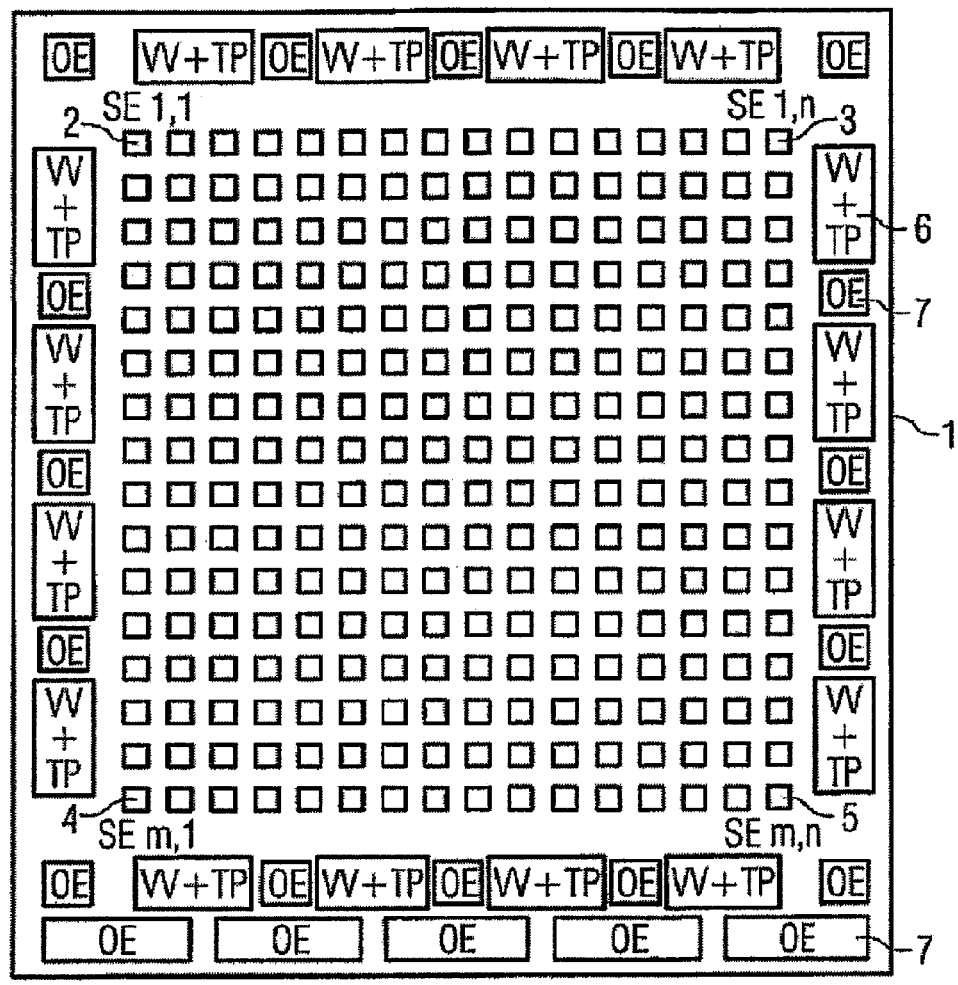
Figure 3:
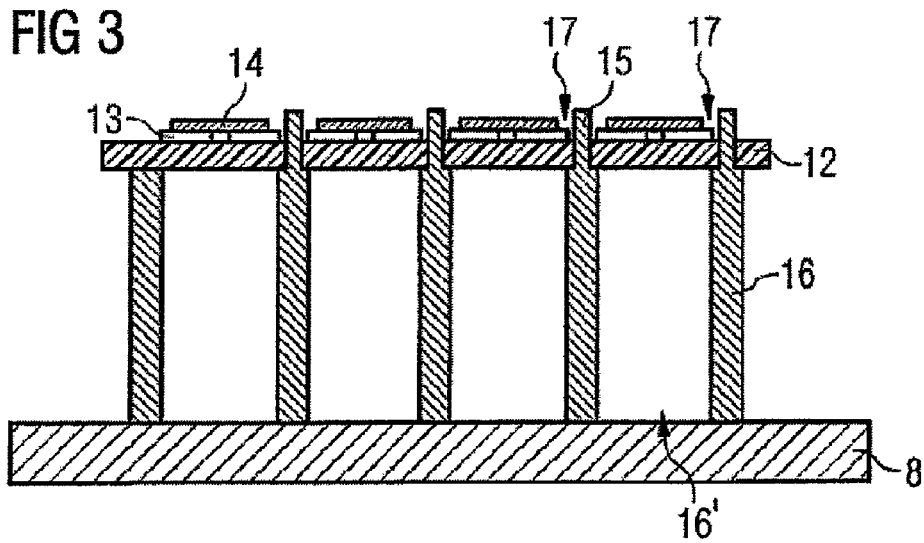
Figure 4:
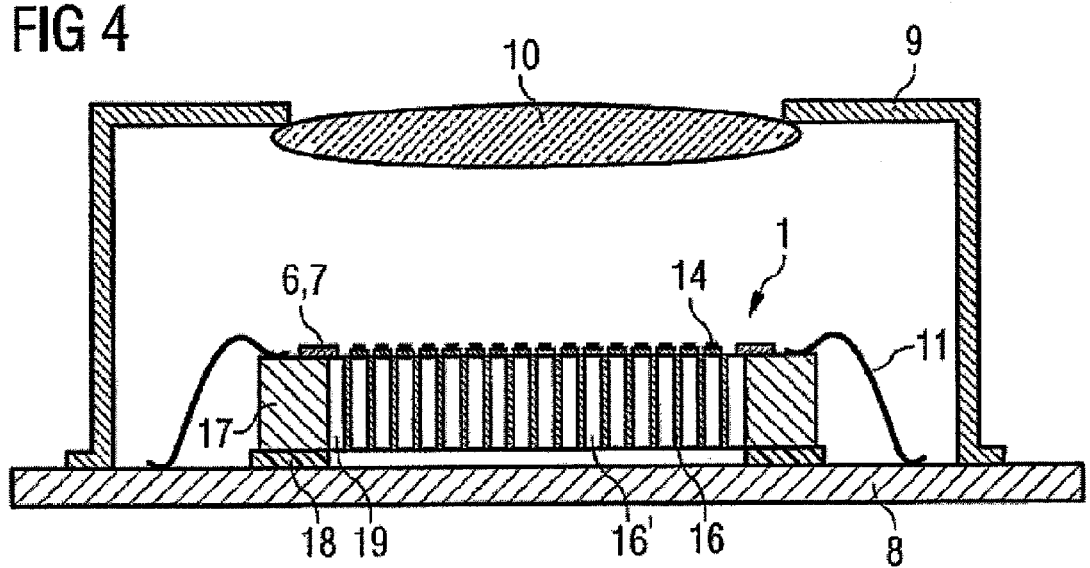
Figure 5:
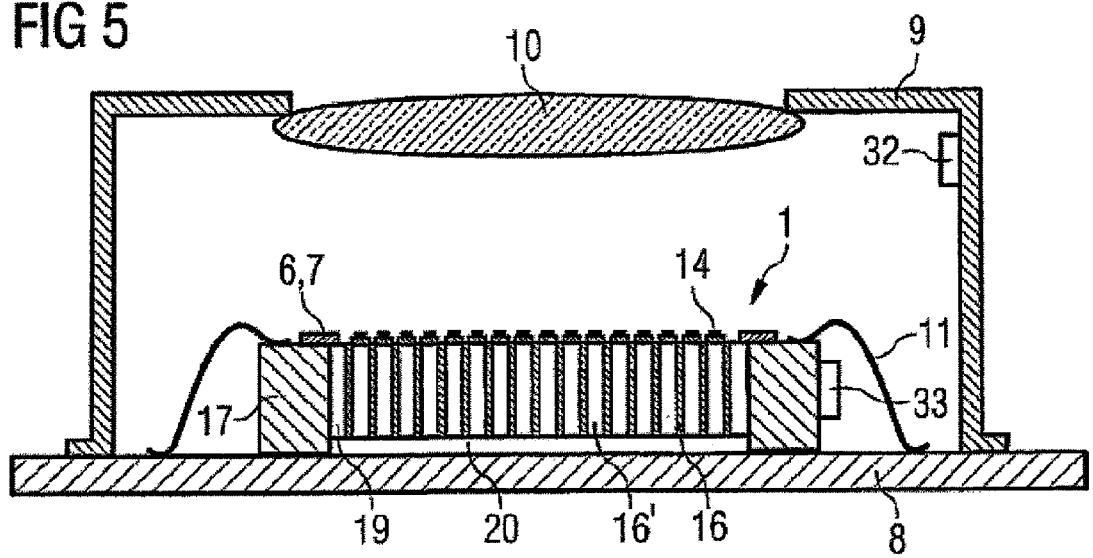
Figure 6:
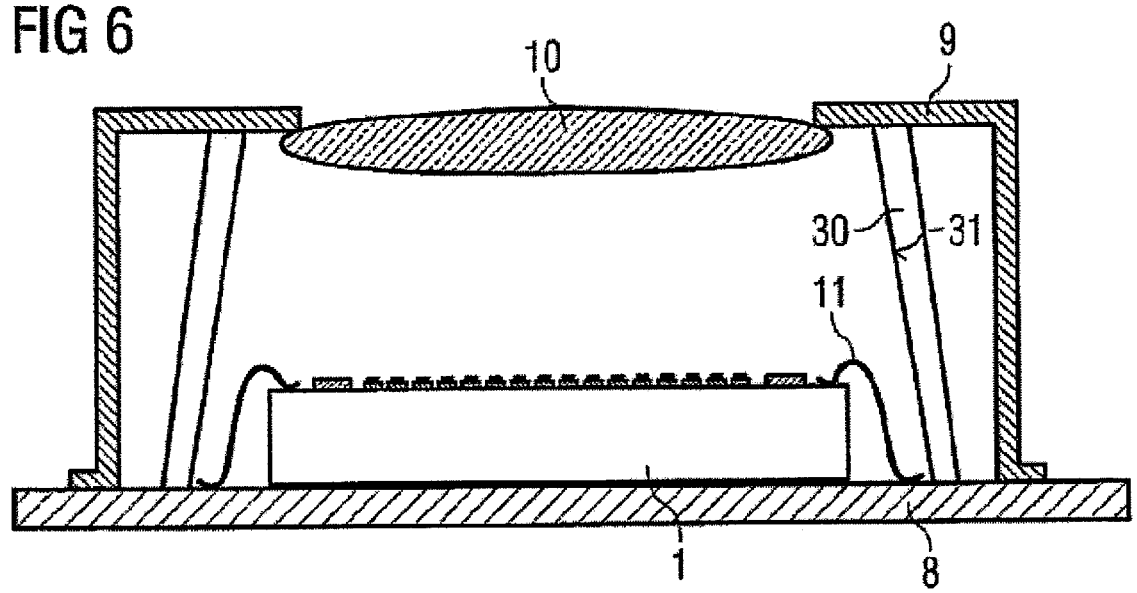
Figure 7:
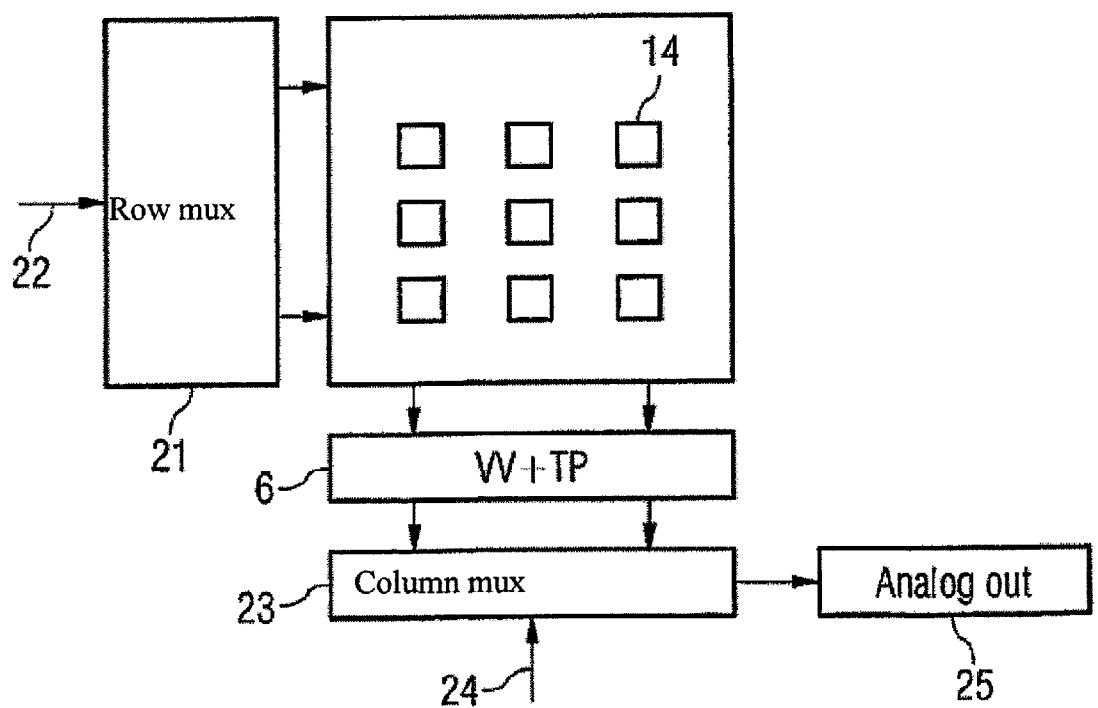
Figure 8A:
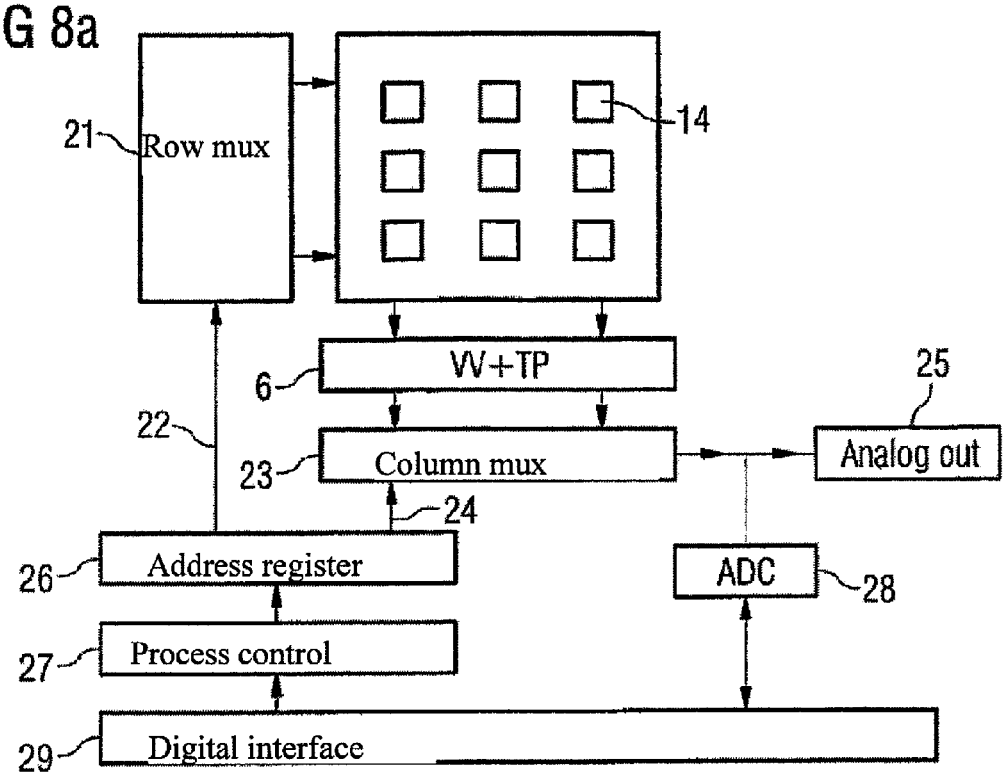
Figure 8B:
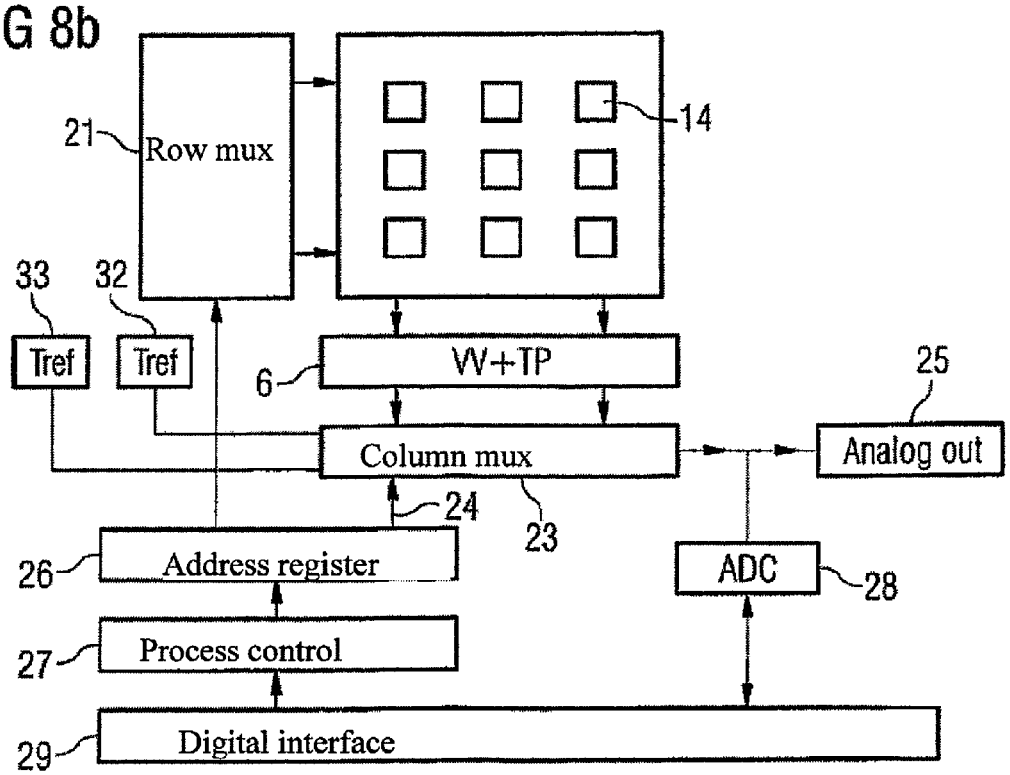
Figure 9A:
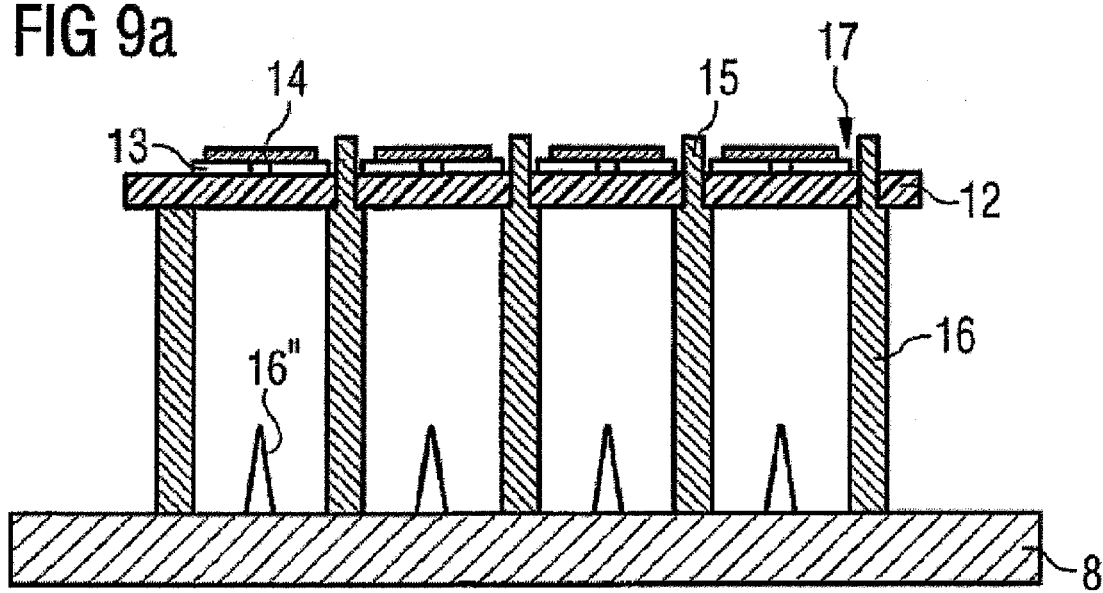
Figure 9B:
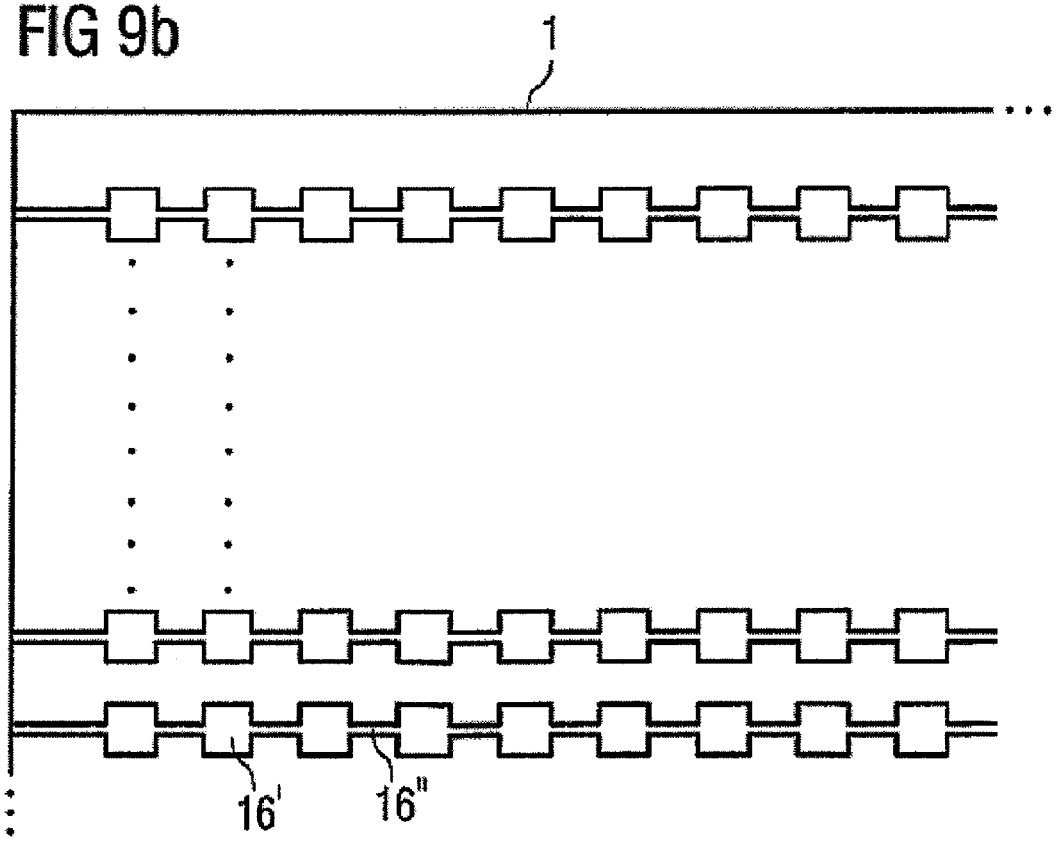

The invention will be further explained below on a practical example. In the corresponding figures of the drawing:

FIG. 1: shows the basic structure of a thermopile sensor array chip according to the invention;

FIG. 2a: shows a top view of the thermopile sensor array chip according to the invention according to FIG. 1;

FIG. 2b: shows a top view of another thermopile sensor array chip with a widened edge on one side as well as electronic circuits arranged on it;

FIG. 3: shows a schematic sectional view of a thermopile sensor array chip according to the invention in cross section;

FIG. 4: shows another embodiment of the thermopile sensor array chip according to the invention with improved thermal insulation between the electronics and sensor elements by an additional spacer;

FIG. 5: shows another embodiment of the thermopile sensor array chip according to the invention with improved thermal insulation between the electronics and sensor elements by etching of the silicon separation walls of different depth;

FIG. 6: shows another modification of the basic layout of the thermopile sensor array chip with an aperture for improved spatial imaging capacity;

FIG. 7: shows a block diagram of a circuit arrangement of the thermopile sensor array chip according to the invention;

FIG. 8a: shows a block diagram of another circuit arrangement according to the invention with digital signal processing of the thermopile sensor array chip;

FIG. 8b: shows the block diagram according to FIG. 8a with additional temperature references on the sensor chip as well as in the housing;

FIG. 9a: shows another embodiment of the sensor chip according to the invention with thin ventilation slits in cross section;

FIG. 9b: shows the embodiment according to FIG. 9a in a bottom view; and

Figure 10:
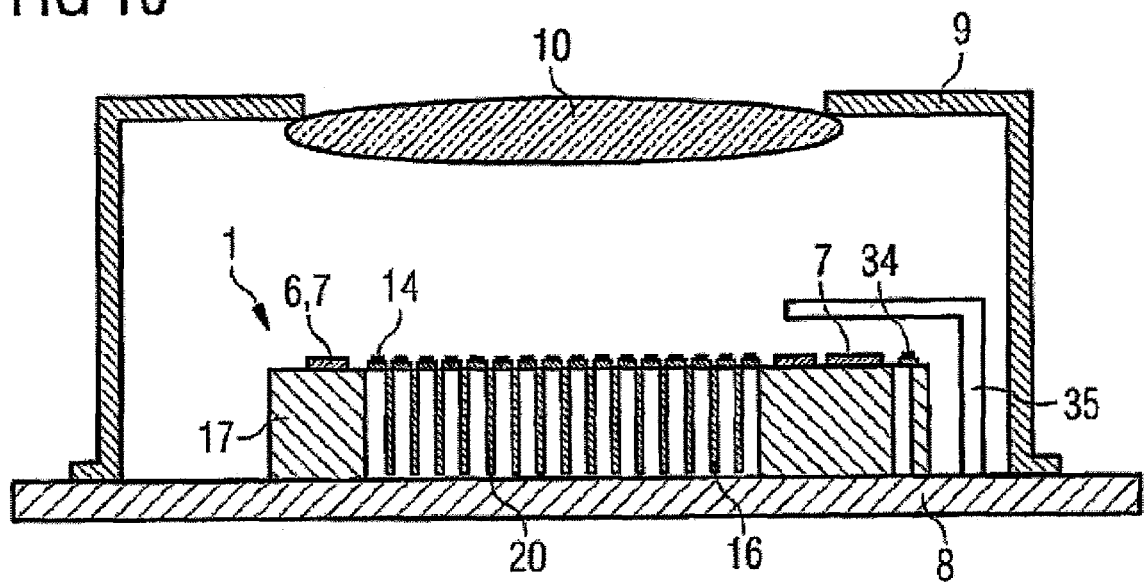

FIG. 10: shows another embodiment of the sensor chip according to the invention with dummy elements and corresponding diaphragms.

DETAILED DESCRIPTION

The thermopile sensor array chip (referred to subsequently as sensor chip 1) is applied centrally according to FIG. 1 on a support substrate 8, for example a bottom plate, and covered with a cap 9. The cap 9 contains an opening for the inlet optics 10, which is arranged precisely above the center of the sensor elements of sensor chip 1. The inlet optics 10 can be a plane-parallel filter or a lens optics on one side. The connection between the sensor chip 1 and the support substrate 8 can be produced by joining by gluing, soldering, glazing or also by welding. The joining method should have very high heat conductivity. An adhesive filled with metal or ceramic, a metal-filled glazing or solder is suitable as joining method.

The variant with filter is not shown in FIG. 1 and in this case a lens must be additionally mounted outside of the housing.

In the variant depicted in FIG. 1 an imaging lens is provided as inlet optics 10. The dimensions of cap 9, sensor chip 1 and the focal width of inlet optics 10 are chosen according to the invention so that the objects being imaged are imaged sharply on the sensor elements via the lens. Contacts or plug connector are ordinarily arranged on support substrate 8 (not shown in FIG. 1), in order to convey the output signals of sensor chip 1 to other assemblies. The electrical connection between the sensor chip 1 and contacts on the support substrate 8 occurs via wire bridges 11, which can be produced by ordinary wire bonding technology.

FIG. 2a shows a top view of sensor chip 1. The sensor elements (SE) 2, 3, 4, 5 of the sensor array, which are shown symbolically by squares, are situated in the middle part of the sensor chip 1. The sensor elements SE are arranged as a two-dimensional field with m rows and n columns. Consequently the sensor element 2 is the sensor element of the first row and the first column (SE 1,1); the sensor element 3 is the sensor element of the first row and $n^{th}$ column (SE 1,n) and the sensor element 4 is the sensor element of the $m^{th}$ row and the first column (SE m,1) and the sensor element 5 is the sensor element of the $m^{th}$ row and the $n^{th}$ column (SE m,n).

An array of m=16 rows and n=16 columns is shown in the example.

Electronic assemblies required for operation are situated in the outer area of sensor chip 1 (i.e., outside the sensor elements). These include, for example, preamplifier VV and low-pass filter TP, together denoted with the reference number 6, or other electronic components OE 7. Other electronic components can be address registers, multiplexers, drivers, microcontrollers, analog/digital converters (ADC), temperature references, voltage references, process controls and interface assemblies.

A preamplifier VV is formed according to the invention at least for each row (or each column). In the present case with 16 rows that means preferably at least 16 preamplifiers VV 6 are present.

It is recommended to connect a low-pass TP after each of the preamplifiers VV whose bandwidth (limit frequency of the low-pass) corresponds at least to the row frequency of the array, in order to avoid signal losses. Reference number 6 therefore describes the combination of preamplifier and downline low-pass filter.

Naturally the number of individual preamplifiers can be reduced relative to the number of columns and rows by a multiplexer connected in front. If, for example, precisely one or at least one preamplifer VV is not provided for each row or column, two or more rows can share a preamplifier through a multiplexer.

If, for example, a low-pass is not provided for each preamplifier, two, three or four preamplifiers can share a low-pass via an upline multiplexer.

In the preferred variant with a preamplifier VV and a low-pass TP per column or row the limit frequency of the low-pass filter should not be significantly higher than the row frequency (or column frequency) because the limit frequency of the low-pass limits the total noise of sensor element 1 and the preamplifier.

If, on the other hand, several columns are shared in a preamplifier or several preamplifiers and a low-pass, the limit frequency of the low-pass must be raised accordingly to avoid signal losses. The higher limit frequency, however, leads to higher noise and poorer thermal resolution.

The outputs of each of the preamplifiers with low-pass filter 6 are fed to an output multiplexer (for example column multiplexer 23), which converts the parallel output signals of the preamplifiers with low-pass filter 6 into a serial output signal (see also block diagram in FIG. 7).

The preamplifiers with low-pass filters 6 should have low noise and low offset voltage. This is preferably achieved in known chopper amplifiers (also auto-zero amplifiers). In order to keep the thermal influence on the integrated sensor elements low, the power loss of preamplifiers VV should be small and especially distributed uniformly on the periphery of sensor chip 1. This is achieved according to the invention in that the preamplifiers with low-pass filter 6 are distributed uniformly on the edge of the sensor chip 1.

For example, for the depicted sensor array of 16×16 elements four preamplifiers VV with low-pass filters TP 6 are obtained on each side and with, for example, 128×128 elements there will be 32 preamplifiers VV with low-pass filters TP 6 on each side.

Because the power loss (and therefore the intrinsic heating) of n preamplifiers VV with low-pass filters TP 6 is the dominating heat source according to the invention on the sensor chip, symmetric and uniform arrangement of the preamplifiers VV is given priority. If one or more of the additional electronic assemblies OE 7 also have a significant effect on power loss, these are arranged according to the invention between the preamplifiers with low-pass structures 6 on the chip edge so that uniform heat distribution is achieved.

In principle, several preamplifiers can also share a low-pass (i.e., two or more preamplifiers per low-pass). This reduces the space requirements but simultaneously increases the noise bandwidth so that the attainable temperature resolution deteriorates.

FIG. 2b shows a top view of another sensor chip 1 with an edge area widened on one side (in FIG. 2b on the bottom). The electronic components OE 7 with larger power loss are arranged here on this widened edge area, which guarantees better heat removal relative to the substrate. In this variant part of the other electronic components OE 7 (for example, MUX, parts of the driver, A/D converter, microcontroller, etc.) are arranged on one or more sides of the chip next to the preamplifiers and low-pass assemblies 6. The width of the frame (support element 17) is increased on this account on one or more sides relative to the other sides.

The greater width is compensated by higher power loss (heat loss) of the additional electronic components OE 7. The wider substrate edge can remove proportionately more heat relative to support substrate 8 because of the larger contact surface, which originates from the additional assemblies OE 7 so that homogeneous heat distribution on the chip is retained.

FIG. 3 shows a cross section through part of the thermopile sensor elements 13 (thermoelectric conductor tracks) with absorber structures 14 lying above them for each thermopile sensor element 13. All thermopile sensor elements 13 are situated on a thin thermally well-insulating membrane 12 and are activated with switching transistors and address line 15 and connected to the read-out multiplexer (row multiplexer 21, column multiplexer 23) (see FIG. 7).

The silicon substrate beneath the thin membrane 12 is recessed in honeycomb fashion according to the drawing by a micromachining etching processes (recess 16') and only thin, preferably vertical separation walls 16 bordering the honeycomb structure remain in the silicon substrate between the individual thermopile sensor elements 13, which are connected to the support substrate 8. Separation walls 16 can be additionally be provided on the bottom in the area of support substrate 8 with an air slit 16". For this purpose the silicon substrate is etched from below, for example, to ⅒ to ½ of the substrate thickness. FIG. 9a shows a schematic view of the air slits 16" introduced to separation wall 16 and FIG. 9b shows a view of the silicon substrate beneath membrane 12 with air slits 16', which extend over the entire array of sensor elements 2, 3, 4, 5. Such a chip contains at least one thin air slit 16" per row or column of the sensor array, the depth of the air slit being less than the depth of the substrate up to the membrane.

The incorporated slits permit pressure compensation between the individual recesses 16' and the housing interior. Even if during fastening of the chip 1 on the support substrate 8 the individual recesses 16' are sealed off completely with the support substrate 8, gas exchange through air slit 16" prevents rupture of the thin membrane 12 by underpressure or overpressure in recess 16'.

The thin membrane 12 consists of a CMOS-compatible dielectric material (for example, silicon dioxide, silicon nitride or silicon carbide or a sandwich structure from them), is deposited by a CVD process in the CMOS process and has a typical thickness of about 1 µm, in which thicknesses between about 0.3 and 4.0 µm are possible in principle. The material parameters are chosen in comparison with the silicon substrate so that, after deposition, no mechanical stresses occur, if possible.

The individual thermopile sensor elements SE 1,1 to SE m,n are arranged on thin membrane 12. Each thermopile sensor element 13 contains a thermopile structure. The known thermopiles consist of two materials with different Seebeck coefficients. These materials are produced in a CMOS process by deposition of polycrystalline silicon or silicon/germanium and aluminum or preferably by n-conducting and p-conducting polycrystalline silicon.

The individual thermocouples each consist of an arm of n-conducting and p-conducting polysilicon. Both polysilicon arms are preferably arranged one over the other and joined on the ends with the next or preceding thermocouple. "Warm" contacts are formed in the center of the membrane on this account and "cold" contacts are formed in the silicon edge area 17 above the silicon separation walls 16 acting as heat sink. The silicon edge area simultaneously serves as silicon support element 17.

An absorber layer that has a particularly high absorption coefficient for infrared radiation is applied about the hot contact.

To increase the signal voltages numerous thermocouples are connected in series so that a thermopile is formed.

Etching of the recess 16' beneath sensor elements 13 occurs, for example, by reactive ion etching (RIE) in a known so-called deep RIE process. This etching occurs from the back and stops on the bottom of membrane 12, for example, on an oxide layer that has very low etching rate in comparison to silicon.

The deep RIE process permits production of separation wall 16 with almost vertical walls. These silicon separation walls 16 have several functions:
  as a heat sink for the cold contacts of the thermopile,
  for thermal separation of thermopiles (avoidance of thermal crosstalk) and
  for mechanical stabilization of membrane 12 and the array.

FIG. 4 shows another embodiment according to the invention of the thermopile sensor array with additional spacer 18. In contrast to the basic structure of FIG. 1 the sensor chip 1 is shown in cross section.

The sensor elements and absorber structures 14 and the silicon separation walls 16 are shown between the sensor elements. In the edge area of the sensor chip 1 the preamplifiers VV and low-pass filters TP 6 and additional electronic assembly 7 are arranged. These electronic assemblies are arranged over the solid edge area of the silicon support element 17 because the power loss that develops (heat) in assemblies 6 and 7 is supposed to be taken off as well as possible to the bottom plate 8. The objective of dimensioning is to keep the forming temperature increase in edge area 6, 7 as small as possible in order to prevent thermal influencing of the sensor elements 14 via membrane 12 (FIG. 3). The electronic assemblies 6, 7 and the sensor elements and absorber structures 14 are electrically connected via wire bridges 11 to the support substrate 8.

FIG. 4 also shows other embodiments of the invention. An additional recess as thermal insulation area 19 is made between the outer sensor elements and absorber structures 14 and silicon support 17 in the edge area without a sensor element 14 being situated above the membrane 12 that continues above it. The additional insulation area 19 is supposed to further reduce the thermal crosstalk of the electronic assemblies 6, 7 on sensor elements 14. The additional insulation area 19 is simultaneously produced with recesses 16' beneath the sensor elements.

Another embodiment of the invention consists of a spacer 18, which connects the silicon support element 17 of sensor chip 1 to the support substrate 8, while the silicon separation walls 16 have no contact with the support substrate 8 between the sensor elements. The spacer 18 must be made from a very good heat-conducting material (for example, metal, ceramic or also silicon). The spacer 18, however, can also optionally be a component of the sensor chip 1.

The entire arrangement is enclosed by a cap 9, which is fastened on the support substrate 8 and in which an inlet optics 10, for example a lens, is situated in the center over sensor chip 1.

Additional embodiments of the thermopile sensor array according to the invention are shown in FIG. 5 with silicon separation walls 16 etched to different depth. In this arrangement the better heat insulation is not achieved by the spacer 18, as shown in FIG. 4, but by additional removal of silicon separation wall 16 from the bottom according to the drawing so that a free-etched gap 20 is exposed above the support substrate 8. This is achieved by an additional etching step in which lower ends of the separation wall 16 are etched off in the central area of sensor chip 1, during which the lower ends of silicon support element 17 must be covered at the same time.

After assembly of the sensor chip 1 the edge area of the sensor hip 1, i.e., the silicon support element 17 sits directly on the support substrate 8, whereas the gap 20 remains between the silicon separation wall 16 and the support substrate 8.

The other structure corresponds to that of FIG. 4.

FIG. 6 shows another embodiment of the sensor array according to the invention. The basic structure of the sensor array with sensor chip 1 on support substrate 8 with wire bridges 11 for electrical contacting and inlet optics 10 contains here an aperture 30. The aperture 30 is arranged continuous within cap 9. This aperture 30 can, for example, be produced from plastic, glass or metallic, ceramic or other insulating materials.

The side 31 facing sensor chip 1 must not be reflecting for infrared radiation. This can occur by selecting the material (most ceramic and plastic materials are not reflecting and require an additional layer), or in metals by an absorbing layer.

The surface 31 which does not reflect infrared radiation is supposed to prevent scattered radiation from the inlet optics 10 from being reflected on the inside wall of cap 9 and reaching the sensor elements SE.

FIG. 7 shows a block diagram of the sensor array according to the invention with a row multiplexer 21 with corresponding control 22 of the row multiplexer, a preamplifier and low-pass arrangement 6 for the individual columns, as well as a column multiplexer 23 with the corresponding control 24. An analog output 25 is also provided, which is connected to the output of column multiplexer 23.

Another block diagram of a circuit arrangement according to the invention is shown in FIG. 8a. Additional assemblies for address register 26, process control 27 and analog/digital converter 28 are provided here. All these assemblies are connected to/from the outside via the digital interface 29. Otherwise FIG. 8a corresponds to FIG. 7.

FIG. 8b shows a block diagram according to FIG. 8a, which, however, is provided with additional temperature references 32, 33. In this case a temperature reference 32 is arranged in sensor chip 1 and temperature reference 33 within cap 9. The initial temperature references 32, 33 are connected directly to the column multiplexer 23 and ensure a good correction of the measured values.

Control of the array can occur both from the outside via the applied addresses and also internally via an internal clock generator and process control 27. The individual rows of the array sensor field are activated in succession (or if necessary with alternating access) via the row multiplexer 21.

All thermopile sensor elements of a column lie parallel to the corresponding output preamplifiers VV 6 of the column and are amplified by it. Since only one of the row elements is activated, at this point only the output information lies on column multiplexer 22. Preferably the low-pass 6 connected after the preamplifier is sealed off with a sample and hold amplifier, which keeps the signal value integrated over a row period constant while the individual column signals are queried in succession and connected to the output of the column multiplexer 23.

To compensate for drift effects and non-homogeneties of the individual preamplifiers VV and low-pass TP 6 (for example, threshold voltage, bias current) it is recommended that a dummy element (for example, thermopile structure with identical resistance but without signal voltage) be inserted for each column of sensor elements. The dummy element is read out as a reference voltage, preferably accumulated (averaged) for several periods for noise reduction and utilized to compensate for drift effects. The dummy element can then be a sensor element shielded against IR radiation from the object with its own membrane or only the resistance structure of a thermopile 13 without the etched membrane.

FIG. 10 shows another embodiment according to invention with a row of dummy elements 34 arranged on the outer edge of sensor chip 1. For this embodiment beneath the dummy elements a recess is made in the same manner as in the actual sensor elements 14. A diaphragm 35 arranged outside of the sensor chip shades the dummy elements 34 relative to infrared radiation from the object, whereas the actual sensor elements see past the diaphragm to the inlet optics 10. This solution permits both drift effects of the individual preamplifiers and low-pass filters and also the so-called heat shock effect by rapid changes in ambient temperature to be compensated.

The diaphragm 35 is mounted in FIG. 10 on the support substrate 8. Depending on the thermal conditions (i.e., the maximum heat input during heat shock) the diaphragm 35 can also be mounted on the cap 9 or aperture 30.

The diaphragm 35 can be mounted either on the support substrate 8, shown in FIG. 10 or also fastened on the inside of cap 9. Another possible mounting location would also be the inside of aperture 30. Fastening to the corresponding assembly can occur by known fastening methods, like gluing, soldering, glazing or also welding.

However, regardless of the installation location it is essential to function that the inside of diaphragm 35 facing the dummy element 34 has a surface that absorbs infrared red radiation. This can occur by selection of the material (most ceramic and plastic materials are nonreflecting) or in metals by an absorbing layer.

THERMOPILE INFRARED SENSOR ARRAY

List of Reference Numbers

1 Sensor chip
2 SE 1,1; sensor element $1^{st}$ row $1^{st}$ column
3 SE 1,n; sensor element $1^{st}$ row $n^{th}$ column
4 SE m,1; sensor element $m^{th}$ row $n^{th}$ column
5 SE m,n; sensor element $m^{th}$ row $n^{th}$ column
6 Preamplifier with low-pass filter
7 OE, other electronic components
8 Support substrate
9 Cap
10 Inlet optics
11 Wire bridges
12 Membrane
13 Thermopile sensor element
14 Absorber structure of a sensor element
15 Switching transistor and address line in the sensor element
16 Separation wall
16' Recess
16" Air slit
17 Silicon support element
18 Spacer
19 Insulation area
20 Free-etched gap
21 Row multiplexer
22 Control of row multiplexer
23 Column multiplexer
24 Control of column multiplexer
25 Analog output
26 Address register
27 Process control
28 Analog/digital converter
29 Digital interface
30 Aperture
31 Surface not reflecting infrared radiation
32 Temperature reference
33 Temperature reference
34 Dummy element
35 Diaphragm for dummy element

The invention claimed is:

1. Thermopile infrared sensor array comprising a sensor chip having a number of thermopile sensor elements constructed on a semiconductor substrate of the sensor chip and corresponding electronic components, the sensor chip being mounted on a support substrate and enclosed with a cap, inlet optics being arranged in a center over the sensor chip, a thin membrane made of nonconducting material being arranged on the semiconductor substrate of the sensor chip, the thermopile sensor elements being situated in an array on the membrane, the substrate in back of the membrane being free etched beneath each thermopile sensor element, the electronic components being arranged in an edge area of the sensor chip, preamplifiers with low-pass filters being provided at least for every fourth, column or row of sensor elements.

2. Thermopile infrared sensor array according to claim 1, wherein the semiconductor substrate of the sensor chip is provided with recesses beneath the sensor elements so that in a boundary area between sensor elements, thin, vertical or almost vertical separation walls made of semiconductor material are situated in the membrane, the membrane covers the recesses, and the sensor chip has a solid peripheral support area.

3. Thermopile infrared sensor array according to claim 2, wherein the separation walls end above the support substrate.

4. Thermopile infrared sensor array according to claim 3, wherein the separation walls are shortened by overetching.

5. Thermopile infrared sensor array according to claim 2, wherein spacers are arranged between the solid peripheral support area and the support substrate.

6. Thermopile infrared sensor array according to claim 2, wherein the separation walls are provided with ventilation slits.

7. Thermopile infrared sensor array according to claim 2, wherein a bottom of the sensor chip is mounted at least beneath the peripheral support area with a joining material of very high heat conductivity on the support substrate.

8. Thermopile infrared sensor array according to claim 7, wherein the bottom of the sensor chip both beneath the peripheral support area and beneath a separation wall is mounted with a joining material of higher heat conductivity on the support substrate.

9. Thermopile infrared sensor array according to claim 7, wherein the joining material is a metal- or ceramic-filled adhesive, a metallic solder or a metal-ceramic-filled glass mass.

10. Thermopile infrared sensor array according to claim 1 wherein individual preamplifiers and the other electronic components are arranged distributed uniformly on the peripheral support area of the sensor chip so that a uniform heat distribution occurs from the developing heat losses.

11. Thermopile infrared sensor array according to claim 10, wherein individual preamplifiers are connected to one or more low-pass filters whose limit frequency is the same or at most two to three times higher than a row readout frequency or a column readout frequency of the array.

12. Thermopile infrared sensor array according to claim 1, wherein the sensor chip is provided with at least one edge area widened on one side on which electronic components with greater power loss are arranged.

13. Thermopile infrared sensor array according to claim 12, wherein individual preamplifiers are connected to a low-pass filter whose limit frequency is the same or higher, than a row or column readout frequency of the array.

14. Thermopile infrared sensor array according to claim 13, wherein the limit frequency is at most two to three times higher than a row or column readout frequency of the array.

15. Thermopile infrared sensor array according to claim 1, further comprising dummy elements wherein a dummy element to compensate for error signals is assigned to each preamplifier in addition to certain sensor elements.

16. Thermopile infrared sensor array according to claim 15, wherein the dummy elements are produced from a same sensor layer as the sensor elements but no recess is arranged beneath the dummy elements.

17. Thermopile infrared sensor array according to claim 15, wherein the dummy elements are constructed identically to the sensor element but are arranged in an edge area of the sensor chip and shielded by a diaphragm from radiation of a measured object.

18. Thermopile infrared sensor array according to claim 15, wherein the dummy elements are provided with cover layers that mask or reflect infrared radiation.

19. Thermopile infrared sensor array according to claim 1, wherein the semiconductor substrate has at least one additional recessed insulation area between a last separation wall of an outer row of thermopile sensor elements and an edge area of the sensor chip.

20. Thermopile infrared sensor array according to claim 1 wherein the cap has a surface that absorbs infrared radiation on an inside facing the sensor elements.

21. Thermopile infrared sensor array according to claim 20, wherein an aperture is arranged within the cap.

22. Thermopile infrared sensor array according to claim 21, wherein the aperture comprises a material that does not reflect infrared radiation.

23. Thermopile infrared sensor array according to claim 20, wherein a side of the aperture facing the sensor elements has a surface coating that absorbs infrared radiation.

24. Thermopile infrared sensor array according to claim 1, wherein the thin membrane comprises silicon dioxide, silicon nitride or a similar material.

25. Thermopile infrared sensor array according to claim 1, wherein the preamplifiers with low-pass filters are provided for every column or row of sensor elements.

* * * * *